(12) United States Patent
Li et al.

(10) Patent No.: US 7,419,519 B2
(45) Date of Patent: Sep. 2, 2008

(54) ENGINEERED NON-POLYMERIC ORGANIC PARTICLES FOR CHEMICAL MECHANICAL PLANARIZATION

(75) Inventors: Yuzhuo Li, Potsdam, NY (US); Kwok Tang, Mississauga (CA); Wu Li, Brampton (CA); Guomin Bian, Toronto (CA); Krishnayya Cheemalapati, Potsdam, NY (US); Vivek Duvvuru, Potsdam, NY (US); Deenesh Bundi, Boise, ID (US); Henry Bian, Toronto (CA)

(73) Assignee: Dynea Chemicals Oy, Helsinki (FI)

( * ) Notice: Subject to any disclaimer, the term of this patent is extended or adjusted under 35 U.S.C. 154(b) by 60 days.

(21) Appl. No.: 11/325,450

(22) Filed: Jan. 5, 2006

(65) Prior Publication Data

US 2006/0261306 A1   Nov. 23, 2006

Related U.S. Application Data

(60) Provisional application No. 60/641,737, filed on Jan. 7, 2005.

(51) Int. Cl.
*B24D 3/02* (2006.01)
*C09C 1/68* (2006.01)
*C09K 3/14* (2006.01)

(52) U.S. Cl. .................. 51/307; 51/308; 51/309; 438/690; 438/691; 438/692; 438/693

(58) Field of Classification Search ........... None
See application file for complete search history.

(56) References Cited

U.S. PATENT DOCUMENTS

| | | | |
|---|---|---|---|
| 4,240,919 A | 12/1980 | Chapman | |
| 4,959,113 A | 9/1990 | Roberts | |
| 5,084,071 A | 1/1992 | Nenadic et al. | |
| 5,114,437 A | 5/1992 | Takeuchi et al. | |
| 5,209,816 A | 5/1993 | Yu et al. | |
| 5,225,034 A | 7/1993 | Yu et al. | |
| 5,340,370 A | 8/1994 | Cadien et al. | |
| 5,366,542 A | 11/1994 | Yamada et al. | |
| 5,391,258 A | 2/1995 | Brancaleoni et al. | |
| 5,516,346 A | 5/1996 | Cadien et al. | |
| 5,527,423 A | 6/1996 | Neville et al. | |
| 5,954,997 A * | 9/1999 | Kaufman et al. | 252/79.1 |
| 6,171,352 B1 | 1/2001 | Lee et al. | |
| 6,245,853 B1 * | 6/2001 | Tang et al. | 524/843 |

(Continued)

FOREIGN PATENT DOCUMENTS

JP    2000-80351 A    3/2000

(Continued)

*Primary Examiner*—Duy-Vu N Deo
(74) *Attorney, Agent, or Firm*—Birch, Stewart, Kolasch & Birch, LLP

(57) ABSTRACT

An abrasive composition comprising composite non-polymeric organic particles that is useful for chemical mechanical planarization (CMP), and which can widely be used in the semiconductor industry. The composite particles individually contain at least one nonpolymeric organic component and at least one other chemical component different from the at least one nonpolymeric organic component. The slurry composition can be vastly simplified if one or more of the components are incorporated into the abrasive particles. The abrasive compositions provide an efficient polishing rate, excellent selectivity and good surface quality when utilized as a new abrasive composition in CMP applications.

18 Claims, 3 Drawing Sheets

Particle Type A

Particle Type B

Particle Type C

Particle Type D

Particle Type E

Particle Type F

U.S. PATENT DOCUMENTS

| | | |
|---|---|---|
| 6,258,721 B1 | 7/2001 | Li et al. |
| 6,576,554 B2 | 6/2003 | Matsui et al. |
| 6,620,215 B2 * | 9/2003 | Li et al. .................. 51/298 |
| 6,777,335 B2 * | 8/2004 | Hasegawa ................ 438/691 |
| 7,037,351 B2 * | 5/2006 | Li et al. .................. 51/298 |
| 2003/0168627 A1 * | 9/2003 | Singh et al. ............. 252/79.1 |
| 2003/0217518 A1 | 11/2003 | Kishii |
| 2005/0005525 A1 | 1/2005 | Li et al. |

FOREIGN PATENT DOCUMENTS

| | | |
|---|---|---|
| WO | WO-03/035736 A1 | 5/2003 |
| WO | WO-03/072683 A1 | 9/2003 |
| WO | WO-2004/031455 A2 | 4/2004 |
| WO | WO-2005/014753 A1 | 2/2005 |

\* cited by examiner

FIGURE 1

Particle Type A

Particle Type B

Particle Type C

Particle Type D

Particle Type E

Particle Type F

FIGURE 2 breakage and/or
dissolution upon
temperature increase
and/or shear force

FIGURE 3

ENGINEERED NON-POLYMERIC ORGANIC PARTICLES FOR CHEMICAL MECHANICAL PLANARIZATION

FIELD OF THE INVENTION

This Nonprovisional application claims priority under 35 U.S.C. § 119(e) on U.S. Provisional Application No(s). 60/641,737 filed on Jan. 7, 2005, the entire contents of which are hereby incorporated by reference.

The present invention relates to a slurry designed for chemical mechanical planarization (CMP), which contains engineered non-polymeric organic particles as a key component. The invention also pertains to methods of preparing engineered non-polymeric organic particles, which can be used in CMP applications, and CMP methods utilizing the same.

BACKGROUND OF THE INVENTION

CMP is a technology used in the fabrication of advanced memory and logic devices for a wide range of applications. The pure substrate surface and complex surface of semiconductor wafer, dielectric layer, conducting wire and barrier materials in the integrated circuits have to be polished to achieve a certain degree of planarity, which is extremely important to reach a high density of integrated circuits. In general, CMP technology consists of three specific key components including polisher, consumables (pad and slurry), and post-CMP clean. The CMP slurry provides a chemical environment to wet and adjust the interaction between abrasive, pad and the wafer surface, and also moderates the mechanical force on the polishing surface. The slurry plays a key role in CMP process and determines the production efficiency and product quality.

The present invention relates generally to the preparation of semiconductor devices and more particularly to improved slurry compositions for the CMP of metal (e.g., Cu) layers and barrier materials (e.g., Ta, TaN, etc.).

Surface planarity is of paramount importance in microelectronics. With the integrated technology approaching the era of Ultra Large Scale Integration (ULSI), CMP is touted as the only viable technique to meet today's planarity requirements. Some of the most important issues in CMP today include dishing and erosion, corrosion, defects of the surface, the control of polishing rate and selectivity among different materials on the surface. The prior art attempts to accomplish these goals as follows.

U.S. Pat. No. 4,959,113 discloses a method of polishing metal surfaces with aqueous slurries. The slurry composition comprises water, abrasive such as $SiO_2$, $Al_2O_3$, $TiO_2$, $ZrO_2$, $CeO_2$, $SnO_2$, SiC, TiC, and a salt containing any cation of group IIA, IIIA, IVA, or IVB and any anion of chloride, bromide, iodide, nitrate, sulfate phosphate, or perchlorate. The patent also discloses a pH range of 1-6 adjusted with mineral acids.

U.S. Pat. No. 5,084,071 discloses the CMP slurry, which comprises abrasive particles, e.g. $SiO_2$, $CeO_2$, $Fe_2O_3$, SiC, $Si_3N_4$, containing less than 1% (w/w) of alumina, a transition metal chelated salt (e.g. EDTA) as a polishing accelerator.

U.S. Pat. No. 5,114,437 discloses the CMP slurry for polishing aluminum substrate, which contains an alumina with an average particle size of 0.2-0.5 µm, and a polishing accelerator from the group consisting of chromium (III) nitrate, lanthanum nitrate, ammonium cerium (III) nitrate and neodymium nitrate.

U.S. Pat. No. 5,209,816 discloses a method for polishing Al— or Ti-containing metal layer with the CMP slurry, which contains inorganic abrasive materials, 0.1-20% by volume of $H_3PO_4$ and 1-30% by volume of $H_2O_2$.

U.S. Pat. No. 5,225,034 discloses the CMP slurry for polishing copper layer on a semiconductor wafer to produce copper wire on the wafer. The slurry comprises $AgNO_3$, inorganic abrasive particles and an oxidant selected from $H_2O_2$, HClO, KClO, $K_2MnO_4$, or $CH_3COOOH$.

U.S. Pat. No. 5,340,370 discloses the CMP slurry for polishing tungsten or tungsten nitride film, which comprises an oxidizing agent such as potassium ferricyanide, inorganic abrasive particles, water, and has a pH in 2-4.

U.S. Pat. No. 5,366,542 discloses a CMP slurry comprising alumina abrasive particles, chelating agent selected from the group consisting of polyaminocarboxylic acid (EDTA) and sodium or potassium salts, and further may contain boehmite or aluminum salt.

U.S. Pat. No. 5,391,258 discloses CMP slurry for polishing silicon, silica or silicate composite. The slurry comprises, in addition to inorganic abrasive particles, hydrogen peroxide and potassium hydrogen phthalate.

U.S. Pat. No. 5,516,346 discloses CMP slurry for titanium film. The slurry contains potassium fluoride, inorganic abrasive particles such as silica, and pH<8.

U.S. Pat. No. 5,527,423 discloses the slurry for polishing a metal layer, which comprises an oxidizing agent such as iron nitrate, alumina particles containing at least 50% gamma phase, nonionic surfactants such as polyalkyl siloxanes, or polyoxyalkylene ethers.

U.S. Pat. No. 6,171,352 discloses a CMP slurry which contains, in addition to inorganic abrasive particles, an abrasion accelerator, wherein the abrasion accelerator comprises monocarboxy group- or an amino group-containing compound and optionally a nitrate salt, also a viscosity modifier such as polyacrylic acid or its copolymer.

U.S. Pat. No. 6,258,721 discloses a CMP slurry of using diamond particles as an abrasive material, comprising ingredients such as an oxidizing agent, chelating agent, surfactant and others.

All of the above reported CMP slurries employ inorganic particles as abrasive materials and fail to adequately control dishing and erosion, corrosion, defects of the surface, polishing rate and selectivity among different materials on the surface.

Another approach to preparing CMP slurries is to use organic polymeric particles as the abrasive material. Such organic polymeric particle containing abrasive materials are disclosed in U.S. Pat. No. 6,620,215. Also, U.S. Pat. No. 6,576,554 teaches a slurry for CMP having a liquid and a plurality of polishing particles, wherein the polishing particle contains a composite particle formed by thermocompressing polymeric organic particles and inorganic particles. However, none of these patents teach or suggest the use of organic non-polymeric abrasive particles in the CMP slurries nor their unexpectedly superior properties.

In U.S. patent application Ser. No. 10/734,232, now U.S. Pat. No. 7,037,351, a set of non-polymeric organic particles are employed as abrasive materials in the formulation of metal CMP slurries. The invention emphasized the importance of surface properties of the particles and the art of formulating metal CMP slurries using such non-polymeric organic particles. This is distinct from the present invention which adds to the art by teaching abrasive particles, which are engineered so they carry specifically designed functions.

SUMMARY OF THE INVENTION

The present invention provides novel CMP compositions and slurries that use organic abrasive particles therein. The invention further utilizes engineered non-polymeric organic particles to control the events during CMP in which the engineered non-polymeric organic particles undergo dynamic changes and provide functions that are not available with conventional inorganic abrasive particles.

The particles in a CMP slurry have at least three functions: serving as an abrasive to cut through the surface to-be-polished, as a carrier to deliver a desired ingredient and/or take away abraded materials from the surface that is being polished, and an agent that modifies the rheological behavior of the slurry. Typically, abrasive materials have been chosen based on their relative hardness. Since it is commonly believed that the hardness of the abrasive particles must be high in order to achieve acceptable removal rates, the abrasive particles commonly used are inorganic particles or polymeric organic particles including silica, alumina, ceria, polystyrene, resin, etc. A review of the prior art shows that non-polymeric soft organic particles have not been considered as a potential key component in slurry formulation until U.S. Pat. No. 7,037,351. The invention described in U.S. Pat. No. 7,037,351 was based on the discovery that these non-polymeric organic particles possess unexpectedly advantageous properties and value in CMP applications and in CMP performance. The present invention includes the manufacturing of particles that can control a metal CMP process via controlling the release of encapsulated functionalities within the abrasive particles.

In addition to the advantages disclosed in U.S. Pat. No. 7,037,351 of the slurry containing non-polymeric organic particles (low defects, high removal rate selectivity, and low sensitivity of removal rate to down force), the engineered organic particles described in this invention provide much greater flexibility and simplicity in slurry formulation, which will translate to a greater cost reduction in slurry manufacturing, transportation, on-site maintenance, and usage. The simplicity in slurry formulation will translate to further reduction in defectivity and increase in throughput. Furthermore, the slurry based on these engineered particles will have lower sensitivity to other CMP operating parameters such as pad and/or ambient temperatures.

For most CMP slurries, the MRR and down force follows a relationship described by the Preston equation:

$$MRR = C \times P + K$$

wherein MRR is the material removal rate, P is the down force or pressure, K is a chemical/mechanical modifier, and C is often referred as Preston Constant.

In U.S. Pat. No. 7,037,351, it was demonstrated that due to the strong interaction between the surface functional groups and the metal surface to be polished, a much smaller Preston constant has been observed for a slurry based on our non-polymeric organic particles in relation to those found in a common commercially available slurry. This invention teaches how to use engineered organic particles to control or tune the Preston constant C and K. More specifically, a slurry with a set of specific Preston constants can be formulated with particles that have a specific functionality release profile.

DETAILED DESCRIPTION OF THE INVENTION

An embodiment of the present invention is a chemical mechanical planarization abrasive composition, which comprises non-polymeric organic particles as an abrasive material and a solvent in the form of slurry.

In an embodiment of the present invention, the non-polymeric organic abrasive particles have an average particle size of less than 1 µm. Preferably, the average particle size is 0.1-0.75 µm. Most preferably, the average particle size is 0.15-0.5 µm. The particles can be reduced in size by various techniques, such as wet grinding, with or without the use of dispersants. The technical advantages to using small particle sizes are fewer scratches, and more contact area so that the end result is a more efficient polishing and better surface quality.

In an embodiment of the present invention, the particle size of the non-polymeric organic abrasive particles has a narrow size distribution. Preferably, >90% of the particles have a particle size which is within +– 25% the mean average particle size. Most preferably, >99% of the particles have a particle size which is within +– 25% the mean average particle size.

The advantages of having a narrow particle size distribution are two fold. One is that a narrow particle size distribution can be directly correlated to a low over sized particle count. Over sized (>1 micron) particles have been linked to various surface defects such as scratches, pull out, and delamination. The other advantage for a narrow particle size distribution is the performance consistency. More specifically, the CMP performance can be more directly and consistently correlated to the particle size and other physical properties.

The chemical structure of the non-polymeric organic abrasive particles is chosen to provide enough intermolecular forces such as hydrogen bonding and/or ionic interaction to hold the molecules together to form primary clusters, which in turn, further aggregate into particles having desirable chemical compositions and physical structures. In modifying the chemical structure of the compounds used in the non-polymeric organic abrasive particles, the particles can be tailored to selectively remove one type of material over another type of material on the surface of the substrate. Furthermore, the chemical composition of the particles will determine the roles and functions, which the particles will provide during a CMP process.

For particles that will provide both static complexation with the metal surface as well as dynamic increase in complexing agent concentration, the molecules are preferred to have at least one of organic functional groups such as hydroxyl, amine, amido, carboxylic, or any other moieties that can form strong complexation with the metal to be polished. For copper CMP, melamine and its derivatives are excellent examples. The strong hydrogen bonding among the molecules hold the particles together to form well defined particles. The amino functionality on the surface provides strong interaction with copper oxide and copper ions. Upon initial contact between the slurry and copper surface, the static interaction between the amino functional group allows the formation of a closely packed layer of particles on the surface which sometimes translates to a reduction in the static etch rate for the copper surface. The flexibility in particle shape gives further intimacy between the particle surface and the surface to be polished. The increase in melamine solubility during polishing due to rising temperatures and shear force further assists the materials removal from the copper surface.

Most preferably, the compound is at least one selected from the group consisting of melamine, melamine derivatives such as acetoguanamine, benzoguanamine, dicyandiamide and salts thereof. Herein the term "non-polymeric" means that the compound does not contain monomer units which are covalently linked to a point where greater than oligomers are formed. Preferably the molecular weight of the non-polymeric compound is less than 1000 g/mole. Most preferably, the molecular weight of the non-polymeric compound is 75-250 g/mole. It is preferred that the non-polymeric compounds are not prepared in a step of combining two or more monomers.

Unlike common slurries that contain a fixed amount of complexing agent, the inventive slurry has an ability to provide desirable amounts of complexing agent in-situ dynamically. More importantly, such a delivery is preferentially accomplished locally according to surface topography. More specifically, a region with higher topography that experiences greater local temperature changes or shear force will be provided with a greater amount of complexing agent dynamically. The consequence of such a selective release is an increase in step height reduction efficiency.

In addition to its chemical functionality that can form effective complexes with the metal ions to be removed from the surface, the complexing agent should be stable at room temperature as a solid. In some designs, it is even further required that the solubility of the solid is low at room temperature and high at an elevated temperature. In some designs described below such a requirement is not as important as the others. To illustrate the molecular design, the following are some representative complexing agents with α-amino acids as the core structure.

α-amino acid aromatic variation of α-amino acid

α-amino amide

The above-group of organic precursors can be classified as a derivative or variation of an alpha amino acid. These alpha amino acids can form a strong complexing agent with copper ions.

Compounds having a core beta amino acid, also have an ability to strongly interact with copper ions. These structures are provided below.

The structures shown above are for illustration purposes only. Other structures with similar functionalities can be easily identified by those skilled in organic chemistry.

In addition to complexing agents, the particles may also contain film-forming agents that are solid particles and are derived from benzotriazole such as the one shown below.

Furthermore, the particles may contain solid oxidizers such as persulfate, periodate, permanganate, perchlorate, perborate, and a wide variety of hydrogen peroxide derivatives in solid forms such as hydrogen peroxide—urea.

Figure 1:
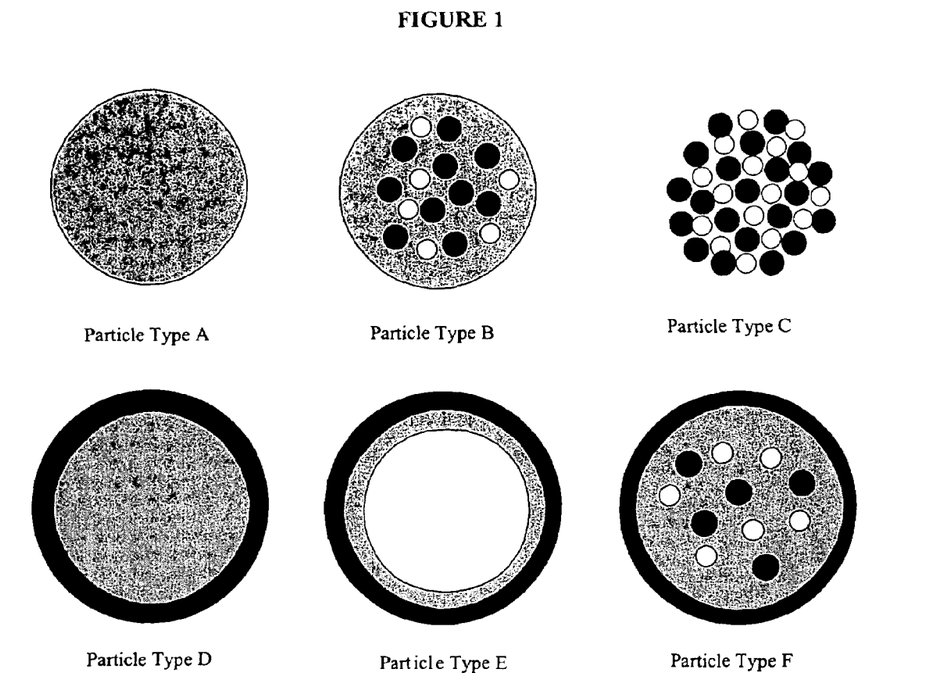
FIG. 1 is a preferred construction of how to engineer the particles that contain key ingredients.

An embodiment of this invention is the process for preparing the particles that comprise the oxidizers, complexing agents, and/or other ingredients. A schematic illustration of preferred constructions is shown in FIG. 1.

The particles described in U.S. Pat. No. 7,037,351, which is herein incorporated by reference in its entirety, can be classified as particle type A in which the entire solid particle is made of a single chemical component which is single crystalline, polycrystalline, or non crystalline form. The chemical component in the particle is homogeneously solidified and held together via intermolecular forces such as hydrogen bonding or ionic interaction.

In an embodiment of the present invention, the CMP composition comprises at least one additional type of particle that provides greater functionality for a particle and simplicity for slurry. In a Type B particle, at least one component forms its own phase that is dispersed in a continuous phase. The encapsulated particles include compounds acting as an oxidizer, a complexing agent, etc. In a type C particle, the two or more phases are physically mixed together. There is no distinctive continuous phase. In a type D particle, the two phases are separated by a core-shell structure. The complexing agent can be encapsulated inside of a coating. In a type E particle, the multilayer construction is made. In type F, the combination of type D and B are combined. The present inventors envision that more combinations of this kind can be designed and implemented using techniques of organic chemistry, crystal engineering, and colloidal chemistry and are part of this invention.

Figure 2:
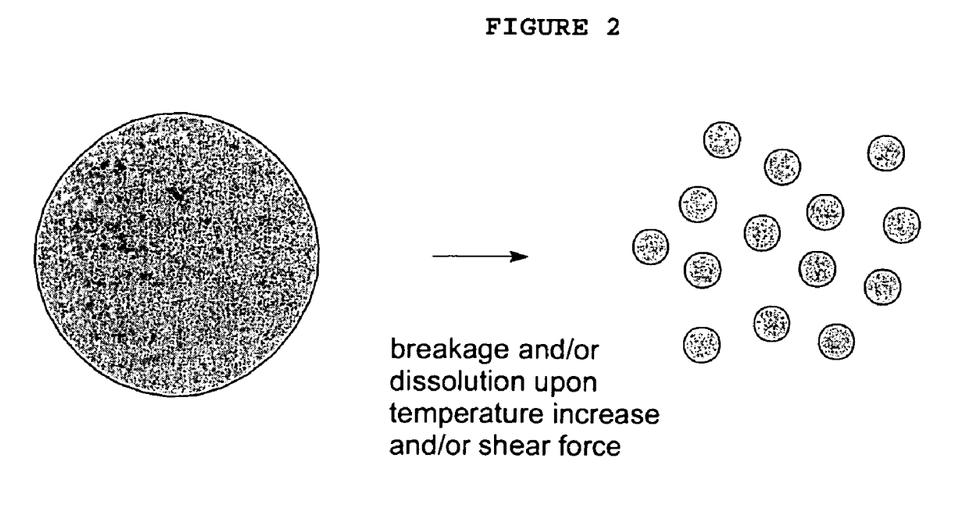
FIG. 2 is a depiction of how a type A particle may break and/or dissolve upon polishing.

These particles may simply deform during CMP, which may increase the contact surface area between the abrasive particles and the surface to be polished. Upon shear force or increase in local temperatures, these particles may also break or partially dissolve. This will further increase the available concentration of that particular type of active chemical component. If it is a complexing agent or an oxidizer, the removal rate at that location will be significantly increased. As shown in FIG. 2, a type A particle may break and/or dissolve upon polishing.

Figure 3:
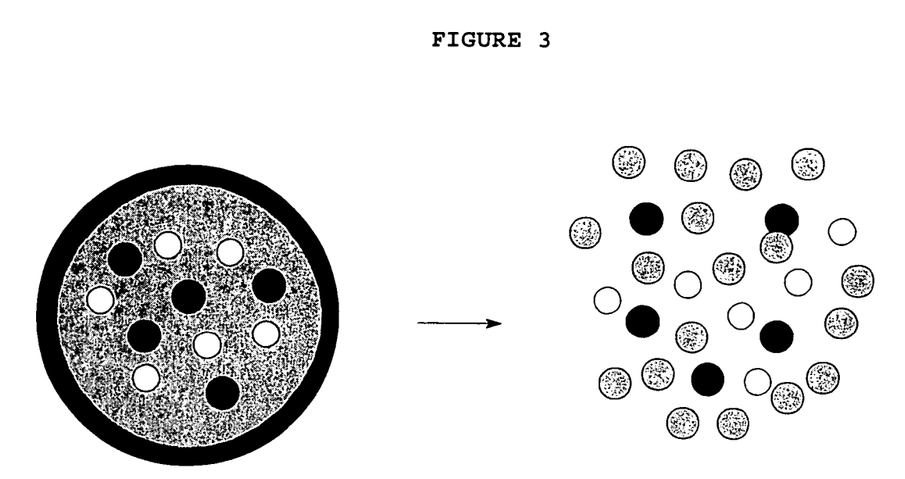
FIG. 3 is a schematic illustration of a particle that has multiple chemical components encapsulated in a non-polymeric organic particle.

Similarly, other types of particles illustrated in FIG. 2 may also undergo the same breakage or dissolution process as illustrated in FIG. 3. FIG. 3, is a schematic illustration of a particle that has multiple chemical components encapsulated in a non-polymeric organic particle. After the breakage of the original particle, the chemical components may start to interact at the location where the particle was broken.

In this case, the chemical components may also start to interact among themselves, which may lead to further chemical reactions in a desirable fashion if the initial particles are carefully designed and manufactured.

In the inventive method of forming the engineered particles, the surfactant plays two roles. The first is to stabilize the particles formed during the engineering process through charge repulsion, steric repulsion, or viscosity increase. The second role is to form supramolecular assemblies which are composite particles containing smaller single component particles in the core of the composite particle so that the single component particles are shielded from directly interacting with the chemicals in the slurry. The first role is similar and yet distinct from that used in the particle formation art. The second role is unique as it provides a composite particle having a number of advantages that show during CMP operation. When the single component particles are oxidizers, such as APS or KPS, these oxidizers can be isolated from interacting with the surface to be polished, and the static etch rate of the surface to be polished is minimized.

Such a combination can form an "intelligent" particle, wherein the oxidizer, passivating agent, and catalytic agent can be retained in two separate phases. When the assembly contains the agent(s) below the surface of the particle, the substrate is not exposed to the retained agent(s) during polishing. However, the supramolecular assembly is capable of releasing the oxidizing functionality or reagent to the targeted surface upon demand during polishing. The release rate can be controlled by a change in pressure and/or temperature. In an area containing a protrusion, a high local pressure will "turn on" (release) the oxidizing functionality and give a high MRR. In a lower or dished area, the low local pressure is not high enough to release the retained agent(s), so that the agent (s) remain "hidden" from the substrate. As a net result, the MRR in the dished area will be minimized, and the degree of corrosion is reduced, which may result in a lower dishing and longer planarity distance.

Two basic criteria are followed in the course of selecting a suitable surfactant for forming the composite particles. The first is to match the charge of the surfactant with the charge of the single component particles to be protected. For example, for melamine particles at pH=5, the particles to be protected are positively charged. To fully and effectively protect such particles, a negatively charged surfactant is better suited. Among widely used negatively charged surfactants, sodium dodecyl sulfate (SDS) and sodium dodecyl benzene sulfate (SDBS) are excellent examples for small anionic surfactants. Among common polymeric surfactants, sodium 2-naphthalene sulfonate formaldehyde condensate and polystyrene sulfonate are representative. The second criterion is its coverage effectiveness. More specifically, the rate of exchange between adsorbed and free dissolving surfactant must be low. In other words, the chance for an encapsulated chemical to be released into the solution by direct dissolution must be low. For this purpose, polymeric anionic surfactant having low water solubility is preferred. One such example is medium molecular weight sodium alkyl naphthalene sulfonates which are commercially available as Petro LBA or Petro LBAF.

The composite non-polymeric organic particles "consist essentially of" the compound(s) and additives as described herein. Herein the phrase "consist essentially of" means that the composite non-polymeric organic particles are greater than 80 w/w % pure in intended additives. The solid particles may contain impurities such as solvent groups crystallized as part of the lattice. Preferably, the non-polymeric organic particles have a greater than 90 w/w % purity. Most preferably, the non-polymeric organic particles have a greater than 95 w/w % purity. The w/w % values are based on the total weight of the particles.

The size and size distribution of the composite non-polymeric organic particles can be controlled using grinding techniques, which are standard in the industry. The grinding may be performed under wet or dry conditions. The size of the particles can be reduced with a homogenizer, which is the preferred means for fragile particles.

In performing a wet grinding, it is preferable to use a dispersing agent/surfactant. Any of nonionic, anionic, cationic and amphoteric dispersing agents/surfactants can be used. Examples of anionic dispersing agents/surfactants are fatty acid salts such as sodium stearate, sodium oleate and sodium laurate; alkylarylsulfonic acid salts such as sodium dodecylbenzenesulfonate; alkyl or alkenyl sulfate ester salts such as sodium lauryl sulfate; alkyl sulfosuccinate ester salts such as sodium monooctyl sulfosuccinate, sodium dioctyl sulfosuccinate (CYTEC TO-75) and sodium polyoxyethylenelauryl sulfosuccinate; sodium salt of special aromatic sulfonic acid-formalin condensate such as the sodium salt of a condensation product of beta-naphthalene sulfonic acid with formaldehyde (DAXAD 19); polyoxyalkylene alkyl or alkenyl ether sulfate ester salts such as sodium polyoxyethylene lauryl ether sulfate; polyoxyalkylene alkylaryl ether sulfate ester salts such as sodium polyoxyethylene nonylphenol ether sulfate; etc.

Further, examples of usable nonionic dispersing agents/surfactants are polyoxyalkylene alkyl or alkenyl ethers such as polyoxyethylene lauryl ether and polyoxyethylene stearyl ether; polyoxyalkylene alkyl aryl ethers such as polyoxyethylene octylphenol ether and polyoxyethylene nonylphenol ether; sorbitan fatty acid esters such as sorbitan monolaurate, sorbitan monostearate and sorbitan trioleate; polyoxyalkylene sorbitan fatty acid esters such as polyoxyethylene sorbitan monolaurate; polyoxyalkylene fatty acid esters such as polyoxyl ethylene monolaurate and polyoxyethylene monostearate; glycerol fatty acid esters such as oleic acid monoglyceride and stearic acid monoglyceride; polyoxyethylene polyoxyproylene block copolymer; etc.

Further, as usable cationic dispersing agents/surfactants, there can be mentioned alkylamine salts such as, for example, laurylamine acetate; quaternary ammonium salts such as, for example, lauryl trimethylammonium chloride and alkylbenzyldimethylammonium chloride; polyoxyethylalkylamine; etc. As amphoteric surfactants, there can for example, be mentioned alkyl betaines such as laurylbetaine, etc.

Among these dispersing agents/surfactants, it is most preferable to use a saturated or unsaturated dialkyl ester sulfosuccinate such as sodium dioctyl sulfosuccinate or a sodium salt of a condensation product of beta-naphthalene sulfonic acid with formaldehyde.

During the wet grinding, it is preferred to keep the temperature from increasing to a point that significant quantities of the crystalline non-polymeric organic particles will dissolve. Preferably, the temperature during wet grinding is 80° C. or less. More preferably, the temperature during wet grinding is 15 to 65° C.

Another method of controlling the size and size distribution of the non-polymeric organic particles is using hydrodynamic cavitation as described in U.S. Pat. No. 5,931,771 to Kozyuk (and the references cited therein). This technique is based on the controlled collapse of vapor bubbles so that the shock waves cause particles to collide and break down.

The present invention discloses methods of preparing such composite non-polymeric particles in compositions and slurries for CMP applications. The invention also discloses the advantages of using such composite non-polymeric organic particles in compositions, slurries, methods and processes.

In an embodiment of the invention, the slurry may further comprise at least one of a surfactant, an oxidizing agent, a chelating agent and a passivation agent.

In an embodiment of the invention, the slurry has 0.001-20 w/w % of non-polymeric organic particles. Preferably, the slurry has 0.005-15 w/w % of non-polymeric organic particles. Most preferably, the slurry has 0.01-10 w/w % of non-polymeric organic particles. The w/w % values are based on the total weight of the slurry.

The solvent used in the slurry is preferably "soft" water. The term "soft" as used herein means that the water has less than 500 ppm heavy metal impurities. Preferably, the soft water has less than 50 ppm heavy metal impurities. Salts and other impurities that do not significantly affect the polishing process of the abrasive slurry do not necessarily need to be removed from the water prior to its use.

When the surfactant is used, it is generally added in a concentration of 0.05-10 w/w % based on the weight of the slurry composition. Preferably the surfactant is added in a concentration of 0.05-3 w/w %. More preferably, the concentration is 0.05-1 w/w %.

The oxidizing agent used in the inventive abrasive composition, can be any suitable commercial oxidant, such as peroxides, chlorates, chlorites, perchlorates, bromates, bromites, perbromate, nitrates, persulfates, iodates, permanganates, and hypochlorites or any mixture thereof. Examples include $H_2O_2$, $ClO_3$, $Fe(NO_3)_3$, $K_2S_2O_8$ $KIO_3$, $K_2MnO_4$, $KMgO_4$, ammonium persulfate (APS), potassium persulfate (KPS) and $CH_3COOOH$. The concentration of the oxidizing agent depends upon the strength of the oxidizing agent. When the oxidizing agent is used, it is added to the slurry in a concentration of 0.01-10 w/w % based on the weight of the slurry composition. Preferably, the concentration is 0.05-10 w/w %. Most preferably, the concentration is 0.1-5 w/w %.

It is highly desirable to improve the selectivity of metal planarization as much as possible. Further improvements in CMP planarization of dielectric/metal composite structures can be obtained by the addition of a chelating agent to the slurry, which is selective for the metal component of interest. This results in a further increase in the corrosion rate of the metal phase and increased selectivity of metal versus dielectric phase removal, making the planarization process much more efficient.

The chelating agent to be used in the present invention is a compound, which has a multidentate ligand to form a chelate compound with a metal ion. A water-soluble chelating agent is generally used in the present invention, and is preferably a polyamine, polyaminocarboxylic acid and/or an amino acid. The most preferred being an amino acid. Examples of the polyamine include ethylenediamine, 2,2'-bipyridine, and diethylenetriamine. Examples of the polyaminocarboxylic acid include nitrilotriacetic acid, ethylenediamine-tetraacetic acid, and diethylenetriaminepentaacetic acid, and sodium or potassium salts thereof. Glycine is an example of an amino acid chelating agent.

When the chelating agent is used, it is added in an amount of 0.05-10 w/w % based on the weight of the slurry composition. Preferably the concentration is 0.1-7 w/w %. Most preferably, the concentration is 0.1-5 w/w %. With an excessively small amount, the chelating agent does not produce the intended effect of the invention; and with an excessively large amount, the chelating agent is wasteful without any additional advantageous effect.

The CMP slurry may further comprise a passivating agent. When the passivating agent is used, it is generally added in the range of 0.0001-10 w/w % based on the weight of the slurry composition. Preferably, the passivation agent is in a concentration of 0.001-5 w/w %. Most preferably, the concentration is 0.001-1 w/w %. The purpose of the passivating agent is to control the etch rate of at least one of the features. For the etching of copper, an effective passivating agent is a phosphate. The phosphate may be, for example, dilute phosphoric acid or ammonium phosphate, which is added in an effective amount sufficient for passivation. The passivation agent can also be an organic compound containing two or more heteroelements such as nitrogen, sulfur, phosphorus, and oxygen.

In general, all benzotriazole (BTA) or benzothiazole compounds can be used as copper film passivating agents. Some representative examples include, but are not limited to 1 H-benzotriazoleacetonitrile, benzotriazole-5-carboxylic acid, 2(3H)-benzothiazolone, and 1 H-benzotriazole-1-methanol.

The CMP slurry may also contain inorganic abrasive particles. Generally, the inorganic abrasive particles are added in a concentration of 0.01-10 w/w % based on the weight of the slurry composition. Preferably, the concentration is 0.5-5 w/w %. More preferably, the concentration is 0.5-2 w/w %. The abrasive agent can be formed of any inorganic particles, as long as the hardness is in a range of 1,200 to 10,000 kg/mm (as measured by atomic force microscopy). The inorganic abrasive agent includes at least one of $SiO_2$, $Al_2O_3$, $ZrO_2$, $ZrSiO_4$, $CeO_2$, SiC, $Fe_2O_3$, $TiO_2$, $Si_3N_4$ and diamond.

The CMP slurry may further comprise polymeric abrasive particles. These polymers are prepared from a conventional process such as that described in U.S. Pat. Nos. 6,620,215, 6,245,853 and 6,576,554 which are herein incorporated by reference in their entirety. The polymeric abrasive particles can be added in a concentration of 0.1-20 w/w % based on the weight of the slurry composition. Preferably, the polymeric abrasive particles are added in a concentration of 1-15 w/w %. More preferably, the concentration is 1-5 w/w %. The organic resin particles have an average particle size in a range of 0.05-5 microns. Preferably the average particle size is 0.05-1 micron. Most preferably, the average particle size in a range of 0.1-0.5 micron.

The hydrogen ion concentration of the CMP slurry is pH 1-13, preferably 2-12, and most preferably 4-10. The pH is adjusted with an acid or base. Acids include any mineral acids such as sulfuric acid, hydrochloric acid, and nitric acid, or organic acids such as acetic acid. The base is an alkaline earth metal hydroxide, ammonia or an organic amine. The pH can also be maintained by adding a buffer solution.

The polishing composition of the present invention may be incorporated with the following additives depending upon the type of object to be polished or upon the conditions for the polishing operation.

Examples of the additives include water-soluble alcohols such as methanol, ethanol, propanol, and ethylene glycol; organic polyanionic substances such as lignin sulfonate, carboxymethylcellulose salt, and polyacrylates; celluloses such as cellulose, carboxymethyl cellulose, and hydroxyethyl cellulose; and inorganic salts such as ammonium sulfate, ammonium chloride, ammonium acetate and magnesium nitrate.

The polishing composition of the present invention may be produced as a stock of high concentration, which is diluted at the time of use. The above-mentioned concentrations relate to the polishing composition ready to use.

The polishing composition of the present invention is used for the polishing of metal, glass, and plastics. It is particularly suitable for the polishing of metal films because of its ability to provide a defect-free polished surface.

Depending upon the complexity of the substrate to be polished, it is possible to use a first slurry, which selectively removes one component from the substrate, and then use a second slurry which has been tailored to remove a second component from the substrate. Typically, after each polishing stage, there is a cleaning stage.

The technique of CMP planarization and cleaning operations are practiced in conventional fashion, such as can been found in the literature. In this regard, the following references are representative: "CMP Grows in Sophistication", Semiconductor International, November 1998 Cover Story, Ruth Dejule, Associate Editor; Sethuraman, "CMP—Past, Present and Future", Future Fab, Issue 5 (Mar. 10, 1999); and "Slurries and Pads Face 2001 Challenges", Semiconductor International, Alexander E. Braun, Associate Editor, November 1998.

Unless otherwise noted herein all %'s refer to weight/weight (w/w) percentages, and in the case of compositions and slurries of the instant invention they refer to w/w %'s based on the total weight of the compositions and slurries.

The following examples are provided in order to illustrate certain preferred embodiments of the instant invention. Accordingly, the following examples are not to be construed as being limiting to the instant invention as more broadly set forth herein or the equivalents thereof which are known and understood by those of ordinary skill in the art and which are readily apparent to the same.

EXAMPLES

Testing Methods:

Preparation of Melamine Particles for use in CMP Slurry

Melamine particles were reduced in size to less than one micron by various techniques, such as wet grinding, with and without the use of dispersants. The following table shows different samples, with corresponding process conditions:

| Sample | Composition | Wt. of solids, (g) | Total Wt., (g) | % Solid |
|--------|-------------|-------------------|----------------|---------|
| (X) | Melamine[a] + Deionized Water | 748 | 4317 | 17.34 |
| (Y) | Melamine[a] + Deionized Water + 1.54 g Dispersant A[b] | 770 | 4441 | 17.34 |
| (Z) | Melamine[a] + Deionized Water + 7.82 g Dispersant B[c] | 780 | 4503 | 17.34 |

[a]The melamine was reduced in particle size using hydrodynamic cavitation
[b]Dispersant A is a sulfosuccinate ester salt
[c]Dispersant B is a sodium salt of aromatic sulfonic acid-formalin condensate Slurry Preparation Using Ammonium Persulfate (APS System)

To prepare a primary aqueous slurry, a designated amount of melamine particles is first dispersed in deionized (DI) water containing a pre-determined amount of polystearyl ether (surfactant) and with the assistance of sonication forms a uniform dispersion. The slurry container is then placed on a magnetic stirrer plate and stirred for 10 minutes.

Sonication is then applied for an additional 25 minutes. The slurry container then is placed back on the magnetic stirrer and stirred for 2 minutes. Formulated amounts of all other ingredients, such as glycine and APS, are added into the slurry during stirring. The slurry pH is adjusted by using potassium hydroxide solution to the desired range within five minutes.

A typical primary slurry is formulated with the following composition: 0.1-1 w/w % APS, 0.1-1 w/w % glycine, 0.1-2 w/w % melamine, 0.1 w/w % surfactant, and deionized (DI) water.

This slurry could also have been prepared with potassium persulfate (KPS) in combination with or in place of APS.

Slurry Preparation Using Peroxide ($H_2O_2$ System)

To prepare a primary aqueous slurry, a designated amount of glycine and BTA are first dispersed in deionized (DI) water. The slurry container is then placed on a magnetic stirrer plate and stirred for 10 minutes. The amount of melamine particles required according to the formulation is then added into the solution continuing the process of stirring. Finally the required amount of $H_2O_2$ is added into the system after-which the pH is adjusted to 5.00 with conc. HCl.

A typical primary slurry is formulated with the following composition: 0.1-1 glycine w/w %, 1-5 mM BTA, 1-5% melamine and DI water.

Disc Polishing

A disc of 1" diameter by 0.25" thickness purchased from Kamis Inc, is mounted onto a single side polishing machine (Struers Labopol 5 Grinding Table, Serial # 5200825 and Struers LaboForce 3 Force Arm, Serial #5210461, manufactured by Struers Inc, Westlake, Ohio) which has a soft polyurethane polishing pad mounted onto its lower side. Polishing is conducted for three minutes using a pressure of 6 psi with a slurry flow rate of 60 ml/minute. The disk and the pad have a relative rotating speed of 150 rpm. After polishing, the disk is removed from the polisher and ultrasonic cleaning is performed to clean the polished surface of the disk. The weight loss of the disk is measured and the average material removal rate (MRR) is calculated.

Static Etching Experiment

Three 1" diameter by 0.25 thickness copper discs, which were purchased from Kamis Inc, are put inside a glass beaker and the beaker is placed on a magnetic stir plate. After that 300 ml of slurry is poured into the beaker, which contains three copper discs, and it is continuously stirred for five minutes and elapsed time is monitored by an electronic stopwatch. After five minutes, all the three discs are removed from the beaker and cleaned by using an ultrasonic cleaning method. Then weight loss of the discs is measured by an electronic weighing balance and the average static etching rate (SER) is calculated.

Wafer Polishing

Polishing of 8" blanket wafer: Eight inch blanket wafers (from Montco) are polished on Westech 372M under the following polishing conditions; Down Force (4 psi), slurry flow rate (200 ml/min), platen speed and carrier speed (75/65 rpm being the maximum, respectively). Removal rate is calculated by measuring resistivity at different points on wafer surface (then convert resistivity to thickness) before and after polishing. After polishing surface quality is evaluated by using a Horizon Non-contact optical profilometer.

Polishing of 8" patterned wafer: Eight-inch patterned wafers (SeMaTech 854) are polished with Westech 372-M. The polishing conditions are as follows: wafer pressure (4 Psi); slurry flow rate (200 ml/min); platen speed and carrier speed (75/65 rpm being the maximum, respectively). After polishing, the dishing and erosion are measured using a high-resolution stylus profilometer, Ambios XP-2. The surface quality of the copper, tantalum and oxide wafer is evaluated using a Horizon Non-contact optical profilometer. The scanning size is 268800×268800 nm.

Example 1

Melamine is used in this example to form three separate samples containing type A particles.

In the preparation of Sample (A), melamine is crystallized and is reduced in size to less than one micron with a homogenizer. The temperature of the sample is maintained at 40° C. in the homogenizer. To 800 mL of dispersion containing 50.0 g melamine particles in DI water, 1.0 g of surfactant (BASF P103) was added while stirring. Subsequently, 10.0 mL of stock solution of BTA (0.1 M) was added to the above slurry. Then 167.0 g of 30% hydrogen peroxide was added to the container. The pH of the slurry was adjusted using potassium hydroxide or hydrochloric acid to the desirable pH=5. A small amount of DI water is then added to make a total of 1000 mL.

In the preparation of Sample (B), melamine is crystallized and is reduced in size to less than one micron with a homogenizer. The temperature of the sample is maintained at 40° C. in the homogenizer. To 800 mL of dispersion containing 40.0 g melamine particles in DI water, 1.0 g of surfactant (BASF P103) and 10 g of glycine were added while stirring. Subsequently, 10.0 mL of stock solution of BTA (0.1 M) was added to the above slurry. Then 167.0 g of 30% hydrogen peroxide was added to the container. The pH of the slurry was adjusted using potassium hydroxide or hydrochloric acid to the desirable pH=5. A small amount of DI water is then added to make a total of 1000 mL.

In the preparation of Sample (C), 4 parts of melamine are co-crystallized with 1 part glycine and the co-crystals are reduced in size to less than one micron with a homogenizer. The temperature of the sample is maintained at 40° C. in the homogenizer. To 800 mL of dispersion containing 50.0 g melamine-glycine particles in DI water, 1.0 g of surfactant (BASF P103) was added while stirring. Subsequently, 10.0 mL of stock solution of BTA (0.1 M) was added to the above slurry. Then 167.0 g of 30% hydrogen peroxide was added to the container. The pH of the slurry was adjusted using potassium hydroxide or hydrochloric acid to the desirable pH=5. A small amount of DI water is then added to make a total of 1000 mL.

The following table shows different samples, with corresponding process conditions:

| Sample | Composition | Wt. % of solids[c] | SER (A/min) | MRR (A/min) |
|---|---|---|---|---|
| (A) | Melamine[a] + 1% $H_2O_2$ + 1 mM BTA in Deionized Water | 5 | 354 | 1290 |
| (B) | Melamine[a] + 1% $H_2O_2$ + 1% Glycine + 1 mM BTA in Deionized Water | 5 | 1587 | 6756 |
| (C) | Melamine/Glycine[b] + 1% $H_2O_2$ + 1 mM BTA in Deionized Water | 5 | 450 | 5879 |

[a] The melamine was reduced in particle size using a homogenizer
[b] The melamine-glycine co-crystal was reduced in particle size using a homogenizer
[c] The weight percent is based on the total weight of the slurry.

The prepared organic particles have an average particle size less than 800 nm and relatively narrow particle size distribution. In Sample (A), a melamine particle was introduced as an abrasive particle in the absence of complexing agent. The static etch rate (SER) and material removal rate (MRR) are low. In Sample (B), the complexing agent was introduced into the slurry. Here, both SER and MRR increased when compared to Sample (A). However, when the complexing agent was introduced as a part of the particle in Sample (C), the removal rate increased without any significant increase in SER. This may translate to lower corrosion and higher step height reduction efficiency. The particle system described in Sample (C) is likely classified as Type A; however, it is difficult to know the exact cross section of the particles due to limitations in the powder x-ray diffraction technique.

Example 2

In this example, an oxidizer is co-crystallized with melamine. More specifically, ammonium persulfate (APS) was included in the melamine particle to form three separate samples containing type A particles.

In the preparation of Sample (D), melamine is crystallized and is reduced in size to less than one micron with a homogenizer. The temperature of the sample is maintained at 40° C. in the homogenizer. To 800 mL of dispersion containing 40.0 g melamine particles in DI water, 10.0 g of glycine and 10.0 mL of stock solution of BTA (0.1 M) is added to the above slurry. The pH of the slurry is adjusted using potassium hydroxide or hydrochloric acid to the desirable pH=8. A small amount of DI water is then added to make a total of 1000 mL.

In the preparation of Sample (E), melamine is crystallized and is reduced in size to less than one micron with a homogenizer. The temperature of the sample is maintained at 40° C. in the homogenizer. To 800 mL of dispersion containing 30.0 g melamine particles in DI water, 10.0 g of glycine, 10 g of APS, and 10.0 mL of stock solution of BTA (0.1 M) is added to the above slurry. The pH of the slurry is adjusted using potassium hydroxide or hydrochloric acid to the desirable pH=8. A small amount of DI water is then added to make a total of 1000 mL.

In the preparation of Sample (F), 3 parts of melamine are co-crystallized with 1 part APS and the co-crystals are reduced in size to less than one micron with a homogenizer. The temperature of the sample is maintained at 40° C. in the homogenizer. To 800 mL of dispersion containing 40.0 g melamine-APS particles in DI water, 10.0 g of glycine and 10.0 mL of stock solution of BTA (0.1 M) is added to the above slurry. The pH of the slurry is adjusted using potassium hydroxide or hydrochloric acid to the desirable pH=8. A small amount of DI water is then added to make a total of 1000 mL.

As described in the following table, a comparison would show that the SER and MRR would be low in the presence of only the abrasive particle and absence of oxidizer as in Sample D. In the presence of oxidizer the MRR and SER would be high for both as in Sample E. By encapsulating the oxidizer in the particle, the SER would be low and the MRR high as in Sample F.

The following table contains predictions for how the compositions will perform, and also illustrates the potential advantages of such compositions.

| Sample | Composition | Wt. % of solids[c] | SER (A/min) | MRR (A/min) |
|---|---|---|---|---|
| (D) | Melamine[a] + 1% Glycine + 1 mM BTA in Deionized Water | 5 | low | low |
| (E) | Melamine[a] + 1% APS + 1% Glycine + 1 mM BTA in Deionized Water | 5 | high | high |
| (F) | Melamine/APS[b] + 1% glycine + 1 mM BTA in Deionized Water | 5 | low | high |

[a]The melamine is reduced in particle size using a homogenizer
[b]The melamine-APS co-crystal is reduced in particle size using a homogenizer
[c]The weight percent is based on the total weight of the slurry.

It is believed that the particles used in this example would be type A so that the APS is dispersed throughout the melamine crystalline lattice.

Example 3

This example illustrates the formation of particles in which potassium persulfate (KPS), ammonium persulfate (APS) and/or glycine crystals are incorporated into the melamine matrix to form composite particles of type B.

The following is a specific description of the method for forming APS crystals incorporated into a melamine matrix to form composite particles of type B.

In a 1000 mL three neck round bottom flask, 500 mL of deionized water is first introduced followed by the addition of 15.0 g of melamine. The round bottom flask is equipped with a reflux condenser, a thermometer, and a side addition funnel. The heating mantle outside of the flask heats the solution to ca. 62-63° C. until all melamine particles are dissolved. The pH of the solution is adjusted to about 5.5. To this solution, through the side addition funnel, 30.0 g of APS are introduced as solid powders. As soon as the solid APS is dissolved, the entire solution is brought to a cooling bath containing ice and salt (ca. 4° C.). The precipitated particles are washed 3 times with DI water. Based on the amounts of APS in the wash solution, the amount of APS that is encapsulated in the melamine matrix can be calculated to be about 0.2-1.0%. The amount incorporated would depend on the cooling rate and washing temperature. The higher the cooling rate and lower the washing temperature results in a higher yield of encapsulated APS. Due to the possibility of persulfate thermal decomposition, the temperature of the slurry containing APS is kept below 65° C.

The same procedure is followed without APS as a control experiment.

Also, particles that contain both glycine and APS are prepared. In such event, 30 g of APS and 30 g of glycine are added to a solution of melamine. The same cooling and washing procedures are followed. A similar encapsulation efficiency would be observed for glycine.

The solid particles after washing are then re-dispersed in deionized (DI) water for the polishing tests.

In the preparation of Sample (G), melamine crystals are reduced in size to less than one micron with a homogenizer. The temperature of the sample is maintained at 40° C. in the homogenizer. 3 wt % melamine crystals are combined with 1 wt % glycine, 1 wt % APS and 1 mM BTA in deionized water.

In the preparation of Sample (H), melamine/APS co-crystals are reduced in size to less than one micron with a homogenizer. The temperature of the sample is maintained at 40° C. in the homogenizer. 4 wt % melamine/APS co-crystals are combined with 1 wt % glycine and 1 mM BTA in deionized water.

In the preparation of Sample (I), melamine/APS/glycine co-crystals are reduced in size to less than one micron with a homogenizer. The temperature of the sample is maintained at 40° C. in the homogenizer. 5 wt % of the melamine/APS/glycine co-crystals are combined with 1 mM BTA in deionized water.

As described in the following table, a comparison would show that the SER and MRR would be high in the presence of the abrasive particle and oxidizer as in Sample (G). Samples (H) and (I) show that by encapsulating the oxidizer and optionally the glycine in the composite particle, the SER would be low and the MRR high.

| Sample | Composition | Wt. % of solids[b] | SER (A/min) | MRR (A/min) |
|---|---|---|---|---|
| (G) | Melamine[a] + 1% APS + 1% Glycine + 1 mM BTA in Deionized Water | 5 | high | high |
| (H) | Melamine/APS[a] + 1% Glycine + 1 mM BTA in Deionized Water | 5 | low | high |
| (I) | Melamine/APS[a] + 1 mM BTA in Deionized Water | 5 | low | high |

[a]The crystals are reduced in particle size using a homogenizer
[b]The weight percent is based on the total weight of the slurry.

Example 4

In this example, a solid form of hydrogen peroxide may be used in connection with melamine and a beta-amino acid as a complexing agent.

In a 1000 mL three neck round bottom flask, 500 mL of water is first introduced followed by the addition of 15.0 g of melamine. The round bottom flask is equipped with a reflux condenser, a thermometer, and a side addition funnel. The heating mantle outside of the flask heats the solution to ca. 62-63° C. until all melamine particles are dissolved. The pH of the solution will be adjusted to about 5.5. To this solution, through the side addition funnel, 30.0 g of beta amino acid is introduced as solid powders. As soon as the solid amino acid is dissolved, the entire solution can be brought to a cooling bath containing ice and salt (ca. 4° C.). The precipitated particles are washed 3 times with DI water. According to the content of beta amino acid in the wash solution, the amount of amino acid that is encapsulated in the melamine matrix can be calculated. Higher cooling rate and lower washing temperature are expected to yield higher encapsulated amount of amino acid. The solid particles after washing was then re-dispersed in DI water for the polishing tests.

It is believed that a set of control experiments would illustrate that by having each component (hydrogen peroxide and complexing agent) added into the slurry the SER and MRR would be high. By incorporating them into one single particle with a polycrystalline phase, Type C, the MRR remains high but the SER is low.

Example 5

In this example, melamine having a particle structure of type A is coated with a compound such as BTA carboxylate to encapsulate the inner core of the particle from dissolution. This will further lower the SER. Upon polishing, the shell will break and the inner core will release the components. This is a simple illustration of a Type D particle and is prepared as follows.

In a 1000 mL three neck round bottom flask, 500 mL of water is first introduced followed by the addition of 15.0 g of melamine. The round bottom flask is equipped with a reflux condenser, a thermometer, and a side addition funnel. The heating mantle outside of the flask heats the solution to ca. 62-63° C. until all melamine particles are dissolved. The pH of the solution will be adjusted to about 5.5. The entire solution is brought to a cooling bath containing ice and salt (ca. 4° C.). To the slurry, 5.0 g of BTA carboxylic acid is introduced. After thorough mixing, the precipitated particles are filtered and washed 3 times with DI water. According to the content of BTA carboxylic acid in the wash solution, the amount of BTA carboxylic acid that is coated on the melamine particles can be estimated. The solid particles after washing was then re-dispersed in DI water for the polishing tests.

Example 6

In this example, the particles described in example 4 will be coated with either a film-forming agent such as a procedure described in example 5 or an inactive chemical shell to protect the inner core chemicals from directly interacting with the water media. This should further improve the chemical stability of the slurry and lower the static etch rate without sacrificing MRR. This will be an example for particle Type F and is prepared as follows.

In a 1000 mL three neck round bottom flask, 500 mL of water is first introduced followed by the addition of 15.0 g of melamine. The round bottom flask is equipped with a reflux condenser, a thermometer, and a side addition funnel. The heating mantle outside of the flask heats the solution to ca. 62-63° C. until all melamine particles are dissolved. The pH of the solution will be adjusted to about 5.5. The entire solution is brought to a cooling bath containing ice and salt (ca. 4° C.). To the slurry, 5.0 g of polystyrene sulfonate is introduced. After thorough mixing, the precipitated particles are filtered and washed 3 times with DI water. According to the content of polystyrene sulfonate in the wash solution, the amount of polystyrene sulfonate that is coated on the melamine particles can be estimated. The solid particles after washing was then re-dispersed in DI water for the polishing tests.

Example 7

In this example, the particles that contain active chemical components can be coated first with a film of inactive layer and then with a second layer with opposite charge. This design should further reduce the direct interaction between the chemicals in the slurry and other key chemicals in the core, which may translate to a much greater chemical stability of the particles and slurries. This will be classified as particle Type E and is formed as follows.

To 1000 mL slurry obtained in Example 6, 10 g of dodecyl trimethyl ammonium bromide (DTAB). The charge difference between polystyrene sulfonate and DTAB should ensure a layer of coated of DTAB serving as a protective agent that prevents the direct interaction between melamine and chemical additives in solution.

Example 8

Melamine is used in this example to form two separate samples containing type A particles.

In the preparation of Sample (J), melamine is crystallized and is reduced in size to less than one micron with a homogenizer. The temperature of the sample is maintained at 40° C. in the homogenizer. To a dispersion containing melamine particles in DI water, a surfactant (BASF P103) was added while stirring. Subsequently, a stock solution of BTA was added to the above slurry. Then 30% hydrogen peroxide was added to the container. The pH of the slurry was adjusted using potassium hydroxide or hydrochloric acid to the desirable pH=5. A small amount of DI water is then added if necessary to give the concentrations described in the following table.

In the preparation of Sample (K), the same preparation is performed as in Sample (J), except that 0.05% zirconia is added to the slurry.

| Sample | Composition | MRR (A/min) | SER (A/min) |
|--------|-------------|-------------|-------------|
| (J) | 5% Melamine[a] + 0.6% Glycine + 2.5 mM BTA + 5% $H_2O_2$ | 1500 | 50 |
| (K) | Sample (J) + 0.05% zirconia | 8300 | 400 |

[a]The melamine was reduced in particle size using a homogenizer

In Sample (J), a melamine particle was introduced as an abrasive particle in the presence of a complexing agent and an oxidizing agent. The static etch rate (SER) is low and the material removal rate (MRR) is high for a copper substrate. In Sample (K), the inorganic abrasive particle is added to slurry of Sample (J). Here, both SER and MRR increased when compared to Sample (J).

Each publication cited and/or referred to hereinabove is incorporated herein by reference in its entirety.

The invention being thus described, it will be obvious that the same may be varied in many ways. Such variations are not to be regarded as a departure from the spirit and scope of the invention, and all such modifications as would be obvious to one skilled in the art are intended to be included within the scope of the invention.

What is claimed is:

1. Composite particles for chemical mechanical planarization, wherein the composite particles individually comprise at least one nonpolymeric organic component and at least other chemical component different from the at least one nonpolymeric organic component, wherein said at least one nonpolymeric organic component is melamine or a melamine derivative.

2. The composite particles according to claim 1, wherein said at least one other chemical component different from the at least one nonpolymeric organic component is an oxidizer that can convert the metal film to be polished.

3. The composite particles according to claim 1, wherein said at least one other chemical component different from the at least one nonpolymeric organic component is a passivating agent that can form a protective layer on the metal surface to be polished.

4. The composite particles according to claim 1, wherein a portion of the particles have at least a particle type A configuration.

5. The composite particles according to claim 1, wherein a portion of the particles have at least a particle type B configuration.

6. The composite particles according to claim 1, wherein a portion of the particles have at least a particle type C configuration.

7. The composite particles according to claim 1, wherein a portion of the particles have at least a particle type D configuration.

8. The composite particles according to claim 1, wherein a portion of the particles have at least a particle type E configuration.

9. The composite particles according to claim 1, wherein a portion of the particles have at least a particle type F configuration.

10. A chemical mechanical planarization abrasive composition, which comprises the composite particles according to claim 1 as an abrasive material and a solvent in the form of a slurry.

11. The abrasive composition according to claim 10, wherein the solvent is soft water, the composite particles are present in a concentration of 0.001-20 w/w %, and the slurry further comprises 0.1-10 w/w % of an oxidizing agent, 0.05-10 w/w % of a chelating agent, 0.01-10 w/w % of a surfactant, and 0.0001-10 w/w % of a passivation agent.

12. The abrasive composition according to claim 11, wherein the oxidizing agent is at least one selected from the group consisting of peroxide, chlorate, chlorite, perchlorate, bromate, bromite, perbromate, nitrate, persulfate, iodate, permanganate or hypochlorite.

13. The abrasive composition according to claim 11, wherein the slurry further comprises a complexing agent which is at least one selected from the group consisting of polyamine, polyaminocarboxylic acid or an amino acid.

14. The abrasive composition according to claim 11, wherein the slurry further comprises inorganic abrasive particles which are at least one selected from the group consisting of $SiO_2$, $Al_2O_3$, $ZrO_2$, $ZrSiO_4$, $CeO_2$, SiC, $Fe_2O_3$, $TiO_2$, $Si_3N_4$ or diamond.

15. A chemical mechanical planarization process, which comprises:
applying to a surface of a semiconductor the chemical mechanical planarization abrasive slurry composition of claim 11.

16. The chemical mechanical planarization process of claim 15, further comprising a preliminary step of reducing the size of the composite particles in the presence of an anionic surfactant prior to combining the composite particles in the chemical mechanical planarization abrasive slurry composition.

17. The chemical mechanical planarization process of claim 15, wherein the composition of the surface of the semiconductor comprises copper and the abrasive slurry composition further comprises inorganic abrasive particles.

18. Composite particles for chemical mechanical planarization, wherein the composite particles individually comprise at least one nonpolymeric organic component and at least one other chemical component different from the at least one nonpolymeric organic component wherein a portion of the particles have at least one configuration selected from the group consisting of a particle type B configuration, a particle type C configuration, a particle type D configuration, a particle type E configuration and a particle type F configuration, and wherein said at least one nonpolymeric organic component is melamine or a melamine derivative.

* * * * *